United States Patent
Houdeau et al.

(10) Patent No.: US 6,191,951 B1
(45) Date of Patent: Feb. 20, 2001

(54) SMART CARD MODULE AND SMART CARD INCLUDING A SMART CARD MODULE

(75) Inventors: Detlef Houdeau, Langquaid; Josef Mundigl, Duggendorf; Frank Pueschner, Kelheim; Peter Stampka, Schwandorf-Klardorf; Michael Huber, Nittendorf/Undorf; Josef Heitzer, Bach, all of (DE)

(73) Assignee: Infineon Technologies AG, Munich (DE)

( * ) Notice: Under 35 U.S.C. 154(b), the term of this patent shall be extended for 0 days.

(21) Appl. No.: 09/390,494

(22) Filed: Sep. 3, 1999

Related U.S. Application Data

(63) Continuation of application No. PCT/DE98/00349, filed on Feb. 6, 1998.

(30) Foreign Application Priority Data

Mar. 3, 1997 (DE) ............................................. 197 08 617

(51) Int. Cl.$^7$ .......................... H05K 5/00; G06K 19/077
(52) U.S. Cl. .................... 361/737; 361/767; 361/760; 361/809; 257/679; 235/492
(58) Field of Search ................... 361/737, 736, 361/724, 752, 807, 808, 810, 760; 257/668, 672, 676–679, 684; 235/492

(56) References Cited

U.S. PATENT DOCUMENTS

| | | |
|---|---|---|
| 4,725,924 | 2/1988 | Juan . |
| 4,774,633 | 9/1988 | Dehaine et al. . |
| 4,803,542 | 2/1989 | Haghiri-Tehrani et al. . |
| 5,107,325 * | 4/1992 | Nakayoshi ............................ 257/793 |
| 5,122,860 * | 6/1992 | Kikuchi et al. ...................... 257/679 |
| 5,363,279 * | 11/1994 | Cha ...................................... 361/767 |
| 5,444,301 * | 8/1995 | Song et al. ............................ 257/737 |
| 5,684,330 * | 11/1997 | Lee ........................................ 257/692 |
| 5,888,624 * | 3/1999 | Haghiri et al. ....................... 428/195 |

FOREIGN PATENT DOCUMENTS

| | | |
|---|---|---|
| 26 59 573 C2 | 7/1977 | (DE) . |
| 44 24 396 C2 | 1/1996 | (DE) . |
| 195 12 191 C1 | 8/1996 | (DE) . |
| 195 32 755 C1 | 2/1997 | (DE) . |
| 0 071 311 A2 | 2/1983 | (EP) . |
| 0 207 852 A1 | 1/1987 | (EP) . |
| 0 323 295 A1 | 7/1989 | (EP) . |
| 0 688 050 A1 | 12/1995 | (EP) . |

OTHER PUBLICATIONS

International Publication No. WO 92/13319 (Melbert), dated Aug. 6, 1992.
International Publication No. WO 96/02071 (Badehi), dated Jan. 253, 1996.
Patent Abstracts of Japan No. 06–342794 A (Akiyoshi et al.), dated Dec. 13, 1994.

* cited by examiner

*Primary Examiner*—Jayprakash N. Gandhi
(74) *Attorney, Agent, or Firm*—Herbert L. Lerner; Laurence A. Greenberg; Werner H. Stemer

(57) ABSTRACT

A smart card module includes a semiconductor chip that is electrically conductively connected to a metallic lead frame in which contact areas are formed. The semiconductor chip and the contact areas are electrically conductively contacted through connection areas disposed on a surface of an electrically insulating protective layer applied to the semiconductor chip. That surface faces away from the semiconductor chip. Contact can be established between the connection areas and the contact areas through the use of soldered joints or electrically conductive adhesive bonds. A smart card including the smart card module is also provided.

12 Claims, 1 Drawing Sheet

SMART CARD MODULE AND SMART CARD INCLUDING A SMART CARD MODULE

CROSS-REFERENCE TO RELATED APPLICATION

This application is a continuation of copending International application No. PCT/DE98/00349, filed Feb. 6, 1998, which designated the United States.

BACKGROUND OF THE INVENTION

FIELD OF THE INVENTION

The invention relates to a smart card module and a smart card including a smart card module.

Smart card modules usually include a carrier on which a semiconductor chip is bonded or fastened in some other way. The carrier may be a thin printed circuit board or a plastic sheet having a side remote from the chip on which an electrically conductive layer made of copper or the like is laminated. The layer is structured to form individual contact areas which can be tapped by a card reader. Instead of the laminated carrier sheet, the semiconductor chip can also be fitted to a metallic lead frame, with or without an intermediate carrier, into which the individual contact areas are stamped. The form and size of the contact areas usually depend on specific standard specifications such as, for example, ISO Standard 7816. In conventional smart card modules, electrical contact is made between the semiconductor chip and the contact areas with the aid of bonding wires which are routed from contact-making points of the semiconductor chip to terminal points of the contact areas. As an alternative, the semiconductor chip may be applied by using flip-chip technology.

In order to protect the chip and the connections to the contact areas, a layer of epoxy resin, thermosetting plastic or the like is applied over the chip and the connection points. The finished smart card module is finally implanted in a card carrier of a smart card.

Such smart card modules are disclosed, for example, in German Patent DE 44 24 396 C2, German Patent DE 195 32 755 C1, German Patent DE 26 59 573 C2, U.S. Pat. No. 4,803,542, as well as European Patent Application 0 071 311 A2.

Particularly the smart card module disclosed in German Patent DE 195 32 755 C1, from which the invention of the instant application proceeds, shows a metallic lead frame with a semiconductor chip mounted in flip-chip technology. The lead frame has a three-dimensional structure produced through etching.

German Patent DE 195 12 191 C1 describes specific materials for producing lead frames of smart card modules. Patent Abstracts of Japan Publication No. 06342794 A describes a semiconductor package in which a passivation layer partially covers an electrode surface between a chip surface and a housing.

The smart card modules constructed in the manner described above generally have a component height of at least 500 to 600 $\mu$m. It has not been possible to date to realize smaller component heights. Moreover, due to the relatively large component height of the smart card modules, the card carrier can only be very thin in the region of the module in order not to exceed the predetermined total thickness of the smart card. Sunken locations therefore appear on the card surface in the region of the smart card module.

SUMMARY OF THE INVENTION

It is accordingly an object of the invention to provide a smart card module and a smart card including a smart card module, which overcome the hereinafore-mentioned disadvantages of the heretofore-known devices of this general type, in which the smart card module can be produced in a simple and effective manner and has the smallest possible component height, in which a semiconductor chip is given the best possible protection against mechanical damage and chemical influences and in which it is possible, by using the smart card module, to produce a smart card having an extremely flat surface without bulges or sunken locations.

With the foregoing and other objects in view there is provided, in accordance with the invention, a smart card module, comprising a semiconductor chip having sides; an electrically insulating protective layer disposed on at least one of the sides of the semiconductor chip, the protective layer having a surface facing away from the semiconductor chip; contact-making points disposed on the surface of the protective layer; connection areas electrically conductively connected to the contact-making points; and a metallic lead frame receiving the semiconductor chip with the connection areas disposed at the front, the lead frame having contact areas electrically conductively contacting the connection areas.

The invention is distinguished by the fact that the semiconductor chip is not incorporated as a "naked" chip in the smart card module, but rather is provided with an electrically insulating protective layer on at least one side. The connection areas which are electrically conductively connected to the contact-making points of the semiconductor chip are formed on a surface of the protective layer which is remote from the semiconductor chip. This protective layer ensures increased protection of the semiconductor chip against mechanical stress and, at the same time, keeps away moisture and other harmful chemicals.

In accordance with another feature of the invention, particularly good protection is ensured when protective layers are provided on the top and bottom sides of the semiconductor chip or the semiconductor chip is enclosed by a housing on all sides.

The semiconductor components described, with connection areas disposed on a surface, are usually referred to as "die size packages" and are described, for example, in International Publication No. WO 96/02071.

Electrical contact is made between the semiconductor chip and the contact areas of the metallic lead frame through connection areas located on one of the surfaces of the die size package. For this purpose, the package is placed onto the lead frame with the connection areas at the front, and the electrical contacts are established.

In accordance with a further feature of the invention, the electrical contacts can be established through the use of soldered joints, for example. In that case, the connection areas, which are also referred to as bonding bumps, are composed of a solder material such as soft solder or solder paste or of a soldering-resistant material. In the latter case, a solder material is applied to the connection areas of the semiconductor chip component and/or to the contact-making points of the lead frame, and the soldered joints are then produced.

In accordance with an added feature of the invention, the soldered joints are implemented by using tin-lead solder. The high ductility of this material means that the soldered joints can absorb high mechanical stresses without material fatigue occurring.

In accordance with an additional feature of the invention, particularly good results are obtained when the metallic lead frame is composed of copper or of a copper alloy. Preferred alloys are copper-tin alloys such as $CuSn_6$. The high ductility of these materials means that the smart card modules produced in this way and the smart cards containing these modules have a very low susceptibility to flexural loading. Their reliability is therefore excellent. The tapping side of the lead frame can be provided with one or more protective layers in a known manner.

The soldered joints between the chip connection areas and the lead frame may be produced in a manner that is known per se. In accordance with yet another feature of the invention, the preferred method is hot-air soldering. The soldering capability additionally ensures that the housing has a high resistance to moisture, in other words the risk of cracks in the package due to the ingress of moisture is minimal.

In accordance with yet a further feature of the invention, an alternative contact-making method is connecting the connection areas and the lead frame with the aid of a conductive adhesive. Materials and techniques correspond to those which are customarily used in the field of semiconductor technology.

The mounting of the die size packages can, in principle, be carried out in a conventional manner using customary method steps. The mounting is expediently carried out on a lead frame strip from which the individual smart card modules and the contact areas are separated, only after the positioning and contact-making of the die size packages.

With the objects of the invention in view there is also provided a smart card in which the smart card module according to the invention is implanted through the use of customary methods.

In addition to the already mentioned advantages of increased stability and reliability against mechanical and chemical loading, the smart card modules according to the invention have a number of further advantages. Firstly, they can be produced with a low outlay for materials in a simple, rapid and cost-effective manner. The fact that it is not necessary to cover the mounted semiconductor chip with epoxy resin or the like means that it is possible to save a work step as compared with conventional fabrication methods. In addition, the housing size of the die size package is subjected only to extremely slight fluctuations, with the result that it is possible to produce smart card modules with reproducible contours. Furthermore, the structural height of the smart card modules according to the invention is smaller than that of modules produced in a customary manner. This has an effect on the smart card quality. Due to the small overall component height of the smart card module, wherever the smart card module is to be implanted, the card carrier can have a higher wall thickness than in the case of conventional smart card modules. As a result, the smart card has a flat surface without sunken locations on the card surface.

Other features which are considered as characteristic for the invention are set forth in the appended claims.

Although the invention is illustrated and described herein as embodied in a smart card module and a smart card including a smart card module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
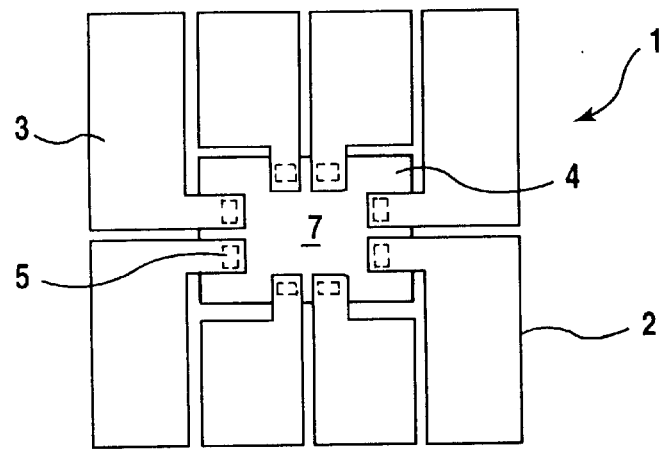
FIG. 1 is a diagrammatic, plan view of a smart card module according to the invention.

Referring now to the figures of the drawings in detail and first, particularly, to FIG. 1 thereof, there is seen a smart card module 1 that includes a lead frame 2, from which contact areas 3 are stamped. The individual contact areas 3 are each electrically conductively connected to a connection area 5, the position of which is illustrated by dotted regions.

Figure 2:
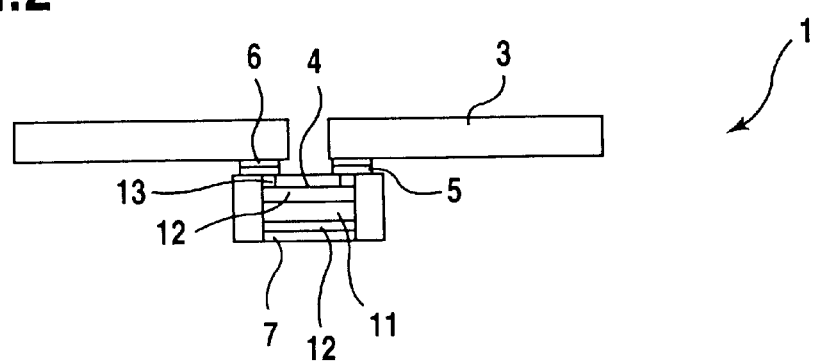
FIG. 2 is a cross-sectional view of the smart card module according to FIG. 1.

The connection areas 5 are disposed on a surface 4 of an electrically insulating protective layer 12 of a die size package or housing 7, as is seen in FIG. 2. In the finished smart card module, the package serves as a link which anchors the contact areas 3 that are stamped from the lead frame during separation of the smart card modules.

FIG. 2 shows the smart card module according to FIG. 1 in cross-section in the region of two connection areas 5. The connection areas 5 are electrically conductively connected to the associated contact areas 3 through the use of a soldered joint 6.

FIG. 2 also shows a semiconductor chip 11 in the package 7 that is to be electrically conductively contacted by the metallic lead frame 2 in which the contact areas 3 are formed. The semiconductor chip 11 is provided with the electrically insulating protective layer 12 on at least one side. The connection areas 5 are electrically conductively connected to contact-making points 13 of the semiconductor chip 11 which are formed on the surface 4 of the protective layer 12 that is remote from the semiconductor chip 11. The semiconductor chip 11 is placed with the connection areas 5 at the front onto the lead frame 2 and is electrically conductively contacted by the contact areas 3 through the use of the connection areas 5.

Figure 3:
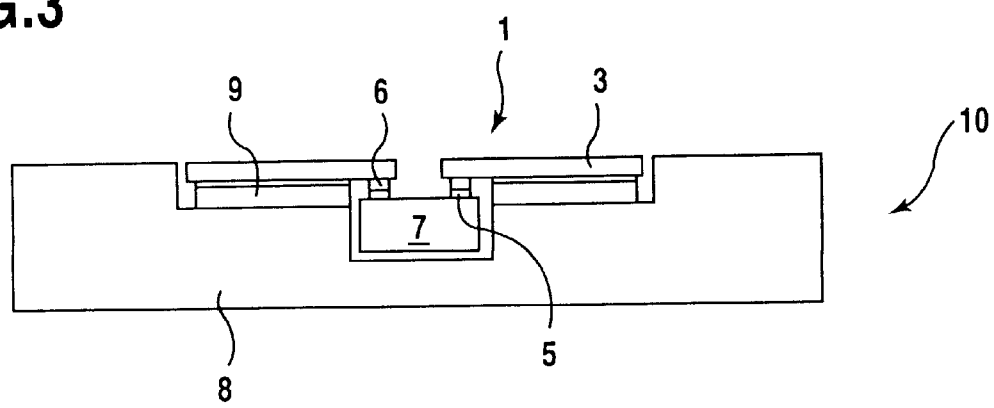
FIG. 3 is a cross-sectional view of a smart card containing the smart card module according to FIGS. 1 and 2.

FIG. 3 illustrates a cross-section through a smart card 10, in which the smart card module 1 shown in FIGS. 1 and 2 is implanted. The implantation is carried out in a conventional manner by bonding the smart card module 1 into a recess in a card body 8 using adhesive 9.

We claim:

1. A smart card module, comprising:
   a semiconductor chip having sides;
   an electrically insulating protective layer disposed on at least one of said sides of said semiconductor chip, said protective layer having a surface facing away from said semiconductor chip;
   contact-making points disposed on said surface of said protective layer;
   connection areas electrically conductively connected to said contact-making points; and
   a metallic lead frame receiving said semiconductor chip with said connection areas disposed at the front with said surface between said lead frame and said chip, said lead frame having contact areas electrically conductively contacting said connection areas.

2. The smart card module according to claim 1, wherein said connection areas are soldered onto said contact areas.

3. The smart card module according to claim 1, wherein said connection areas are fastened by hot-air soldering to said contact areas.

4. The smart card module according to claim 1, wherein said connection areas are fastened to said contact areas by a hot-air soldered joint formed of tin-lead solder.

5. The smart card module according to claim 1, wherein said connection areas are bonded to said contact areas by an electrically conductive adhesive.

6. The smart card module according to claim 1, wherein said lead frame is formed of copper.

7. The smart card module according to claim 1, wherein said lead frame is formed of a copper alloy.

8. The smart card module according to claim 1, wherein said lead frame is formed of a copper-tin alloy.

9. The smart card module according to claim 1, wherein said lead frame is formed of $CuSn_6$.

10. The smart card module according to claim 1, wherein said sides of said semiconductor chip are top and bottom sides, and said insulating protective layer is disposed on said top and bottom sides.

11. The smart card module according to claim 1, including an electrically insulating housing enclosing said semiconductor chip on all sides.

12. A smart card, comprising a smart card module, including:

a semiconductor chip having sides;

an electrically insulating protective layer disposed on at least one of said sides of said semiconductor chip, said protective layer having a surface facing away from said semiconductor chip;

contact-making points disposed on said surface of said protective layer;

connection areas electrically conductively connected to said contact-making points; and a metallic lead frame receiving said semiconductor chip with said connection areas disposed at the front with said surface between said lead frame and said chip, said lead frame having contact areas electrically conductively contacting said connection areas.

* * * * *